(12) United States Patent
Otsubo (10) Patent No.: US 11,291,108 B2
(45) Date of Patent: Mar. 29, 2022

(54) RADIO-FREQUENCY MODULE WITH SHIELD WALL

(71) Applicant: Murata Manufacturing Co., Ltd., Kyoto (JP)

(72) Inventor: Yoshihito Otsubo, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/581,887

(22) Filed: Sep. 25, 2019

(65) Prior Publication Data

US 2020/0022250 A1    Jan. 16, 2020

Related U.S. Application Data

(63) Continuation of application No. PCT/JP2018/013235, filed on Mar. 29, 2018.

(30) Foreign Application Priority Data

Mar. 31, 2017    (JP) .............................. JP2017-072318

(51) Int. Cl.
*H05K 1/02*    (2006.01)
*H05K 9/00*    (2006.01)
(Continued)

(52) U.S. Cl.
CPC ........... *H05K 1/0218* (2013.01); *H01L 23/28* (2013.01); *H05K 3/284* (2013.01); *H05K 3/303* (2013.01);
(Continued)

(58) Field of Classification Search
CPC .... H05K 1/0218; H05K 1/0216; H05K 3/284; H05K 3/303; H05K 9/0024;
(Continued)

(56) References Cited

U.S. PATENT DOCUMENTS

| | | | |
|---|---|---|---|
| 8,849,362 B1* | 9/2014 | Saji | ...................... H04B 1/3888 455/575.1 |
| 2007/0221399 A1 | 9/2007 | Nishizawa et al. | |
| 2011/0013349 A1* | 1/2011 | Morikita | ............. H05K 1/0218 361/679.02 |

(Continued)

FOREIGN PATENT DOCUMENTS

| | | |
|---|---|---|
| CN | 101065842 A | 10/2007 |
| CN | 104602366 A | 5/2015 |

(Continued)

OTHER PUBLICATIONS

Notice of Reasons of Rejection for Chinese Patent Application No. 201880020282.8 dated Mar. 13, 2020.
(Continued)

*Primary Examiner* — James Wu
(74) *Attorney, Agent, or Firm* — Pearne & Gordon LLP (57) ABSTRACT

A radio-frequency module includes a multilayer circuit board, a plurality of components mounted on a top surface of the multilayer circuit board, a sealing resin layer laminated on the top surface of the multilayer circuit board and sealing a plurality of components, and a shield wall disposed in a groove formed in the sealing resin layer between the component and the component. The shield wall has a region that overlaps the component when viewed in a direction perpendicular to the top surface of the multilayer circuit board. The groove in the overlapped region is formed with
(Continued)

a depth that does not reach the component. In the component, a terminal electrode that covers the entire surfaces of side surfaces, and part of a top surface, a bottom surface, and side surfaces is formed.

16 Claims, 5 Drawing Sheets (51) Int. Cl.
*H01L 23/28* (2006.01)
*H05K 3/28* (2006.01)
*H05K 3/30* (2006.01)

(52) U.S. Cl.
CPC ... *H05K 9/0024* (2013.01); *H05K 2201/0715* (2013.01); *H05K 2201/10371* (2013.01)

(58) Field of Classification Search
CPC . H05K 2201/0715; H05K 2201/10371; H05K 2203/1327; H05K 2203/1316; H05K 1/0224; H05K 3/28; H05K 9/00; H01L 23/28; H01L 2924/3025; H01L 2224/16227; H01L 23/3121; H01L 23/552
See application file for complete search history.

(56) References Cited

U.S. PATENT DOCUMENTS

| 2015/0043172 A1 | 2/2015 | Mugiya et al. |
| 2015/0049439 A1 | 2/2015 | Shimamura et al. |
| 2015/0119102 A1 | 4/2015 | Saji et al. |
| 2018/0090466 A1* | 3/2018 | Hung ...................... H01L 23/29 |
| 2018/0199428 A1 | 7/2018 | Otsubo et al. |

FOREIGN PATENT DOCUMENTS

| JP | H06-252581 A | 9/1994 |
| JP | 2015-057804 A | 3/2015 |
| JP | 2015-057815 A | 3/2015 |
| JP | 2015-111747 A | 6/2015 |
| WO | 2017043621 A1 | 3/2017 |

OTHER PUBLICATIONS

International Search Report for International Application No. PCT/JP2018/013235 dated Jun. 19, 2018.
Written Opinion for International Application No. PCT/JP2018/013235 dated Jun. 19, 2018.

* cited by examiner

Prior Art

RADIO-FREQUENCY MODULE WITH SHIELD WALL

This is a continuation of International Application No. PCT/JP2018/013235 filed on Mar. 29, 2018 which claims priority from Japanese Patent Application No. 2017-072318 filed on Mar. 31, 2017. The contents of these applications are incorporated herein by reference in their entireties.

BACKGROUND OF THE DISCLOSURE

Field of the Disclosure

The present disclosure relates to a radio-frequency module that includes a sealing resin layer covering a plurality of components mounted on a circuit board and a shield wall for preventing mutual noise interference between the components.

Description of the Related Art

In some radio-frequency modules that are mounted on mobile terminal devices or other devices, a shield layer for shielding against electromagnetic waves can be provided. In some of radio-frequency modules of this type, components mounted on a circuit board are covered with a mold resin, and a shield layer is provided so as to cover the surface of the mold resin.

Such a shield layer is provided to shield against noise from the outside; however, when a plurality of components is mounted on a circuit board, there is a problem that the noise that is generated from these components interferes with the other components. Therefore, a shield wall that shields against not only the noise from the outside but also the noise between mounted components from each other can be provided so far. A shield wall is, for example, formed as follows. A groove is formed in a sealing resin layer by laser beam machining, and then a conductor, such as electrically conductive paste, is filled into the groove. In this case, under the influence of laser beam at the time of forming a groove, for example, cracks may be formed in a circuit board or an internal circuit board may be damaged. Therefore, hitherto, a radio-frequency module that minimizes the damage to a circuit board while forming a shield between components has been suggested.

Figure 10:
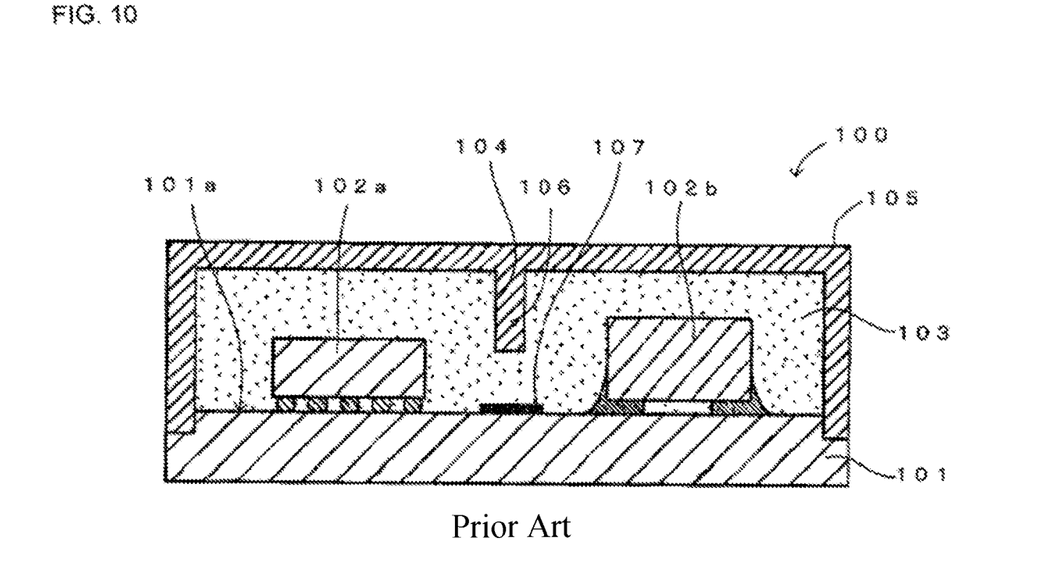
FIG. 10 is a cross-sectional view of an existing radio-frequency module.

For example, as shown in FIG. 10, in a radio-frequency module 100 described in Patent Document 1, a plurality of components 102a, 102b is mounted on a top surface 101a of a circuit board 101, and the components 102a, 102b are sealed by a sealing resin layer 103. A groove 104 is formed in the sealing resin layer 103 between the components 102a, 102b. When the surface of the sealing resin layer 103 is covered with an electrically conductive resin, the groove 104 is also filled with the electrically conductive resin. As a result, a shield layer 105 that functions as a shield for all the components and a shield wall 106 that functions as a shield between components are formed. In this case, the groove 104 that forms the shield wall 106 has a portion that does not reach the top surface 101a of the circuit board 101. Therefore, the damage to the circuit board 101 by laser beam at the time of forming the groove 104 is reduced.

Patent Document 1: Japanese Unexamined Patent Application Publication No. 2015-57815 (see paragraphs 0023 to 0043, FIG. 13, and the like).

BRIEF SUMMARY OF THE DISCLOSURE

However, in the existing radio-frequency module 100, a surface layer electrode 107 for connection is formed in a region that overlaps the groove 104 on the top surface 101a of the circuit board 101, so a component mounting region is limited. The portion where the groove 104 does not reach the top surface 101a of the circuit board 101 is difficult to be shielded against noise, so the function of the shield wall 106 that serves as a shield between components decreases.

The present disclosure is made in view of the above-described task, and it is an object of the present disclosure to provide a radio-frequency module that enables high-density mounting of components and that maintains the characteristics of a shield between the components in a configuration in which the shield is provided between the components.

To achieve the above object, a radio-frequency module of the present disclosure includes a circuit board, a first component, a second component, and a third component mounted on a main surface of the circuit board, a sealing resin layer laminated on the main surface of the circuit board, the sealing resin layer sealing the first component, the second component, and the third component, and a shield wall disposed in a groove formed in the sealing resin layer. The groove has a region disposed between the first component and the second component and a region that overlaps the third component when viewed in a direction perpendicular to the main surface of the circuit board. The groove in the overlapped region is formed with a depth that does not reach the third component. The third component has a first surface facing the main surface of the circuit board, a second surface opposed to the first surface, and a side surface connecting the first surface and the second surface. An electrode is formed on the side surface of the third component. The electrode of the third component and the shield wall are connected to a ground.

With this configuration, the groove in which the shield wall that functions as a shield between components is disposed is formed with a depth that does not reach the third component in the region that overlaps the third component. Therefore, the shield wall does not restrict a mounting area of the circuit board, and high-density mounting of components is possible. In this case, in the region of the groove, which overlaps the third component, no shield wall is formed between the bottom of the groove and the circuit board; however, the electrode is formed on the side surface of the third component. Therefore, the electrode on the side surface closes the portion where no shield wall is formed and is caused to function as a part of a shield between the components. Thus, the shielding characteristics of the shield wall are maintained. When the portion that does not reach the main surface of the circuit board is formed at a portion of the groove forming the shield wall, the groove does not completely separate the sealing resin layer. Therefore, warpage or deformation of the radio-frequency module is suppressed.

When viewed in the direction perpendicular to the main surface of the circuit board, an electrode may be formed in a region on the second surface of the third component, overlapping the shield wall.

With this configuration, for example, when the groove for disposing the shield wall is formed by laser beam machining, the influence of laser beam on the third component is reduced. Therefore, a gap between the third component and the groove is reduced, and the shield characteristics of the shield wall are improved.

The shield wall may have an angled portion when viewed in the direction perpendicular to the main surface of the circuit board. The third component may be not disposed at a portion that overlaps the angled portion of the shield wall when viewed in the direction perpendicular to the main surface of the circuit board. The groove of the angled portion may be formed with a depth to make the main surface of the circuit board exposed.

With this configuration, for example, in the case where the groove in which the shield wall is disposed is formed by laser beam machining, or the like, when the groove has an angled portion, a laser irradiation duration extends at this portion because scanning of laser instantaneously stops, so the energy of laser beam more intensively acts on this portion than the other portions. Thus, the depth of the groove increases under the same laser conditions. This tendency is particularly remarkable when the angled portion is a right angle or an acute angle. Therefore, when the third component is not disposed at the angled portion, the influence of laser beam at the time of the formation of the groove on the characteristics of the third component is reduced. The irradiation conditions of laser beam do not need to be changed according to a portion of the groove, so the shield wall is easily formed.

A plurality of the third components may be provided. When viewed in the direction perpendicular to the main surface of the circuit board, the plurality of third components may be arranged along the shield wall. The groove may be formed with a constant depth to make the main surface of the circuit board not exposed.

With this configuration, the groove in which the shield wall is disposed does not reach the main surface of the circuit board. Therefore, when the groove is formed by laser beam machining, the influence of laser beam on the circuit board is reduced. A mounting region for components increases, so high-density mounting of components is possible. When the depth of the groove is made constant, the groove is formed under the same irradiation conditions of laser beam. Therefore, the shield wall is easily formed.

When viewed in the direction perpendicular to the main surface of the circuit board, the groove in the region of the shield wall, which does not overlap the third component, may have a wide width portion formed in a shallow region in a depth direction and having a wide groove width, a narrow width portion formed in a deep region in the depth direction and having a narrow groove width, and a boundary portion that continuously connects the wide width portion and the narrow width portion. The wide width portion may be formed such that a groove width of an end portion closer to the boundary portion in the depth direction is formed to be wider than a groove width of an end portion closer to the boundary portion in the depth direction of the narrow width portion, and a maximum value of the groove width of the narrow width portion is less than a maximum value of the groove width of the wide width portion. When viewed in the direction perpendicular to the main surface of the circuit board, a maximum value of a width of the groove in the region that overlaps the third component of the shield wall may be less than a maximum value of a groove width of the wide width portion.

With this configuration, the groove in which the shield wall is disposed is formed deep in the region that does not overlap the third component and formed shallowly in the region that overlaps the third component. When the shield wall is formed from electrically conductive paste, electrically conductive paste is difficult to be completely filled into a place where the groove is deep. However, the maximum value of the groove width of the wide width portion of the region where the groove is shallow is formed so as to be greater than the maximum value of the groove width of the narrow width portion of the region where the groove is deep.

Therefore, without significantly reducing a mounting region for components, the capability of filling electrically conductive paste at a position where the groove is deep improves. The maximum value of the groove width of the region where the groove overlaps the third component (the region where the groove is shallow) is less than the maximum value of the groove width of the wide width portion. However, the depth of the groove is shallow in that region, so the capability of filling electrically conductive paste is ensured.

The shield wall may be connected to a ground electrode formed on or in the circuit board in the region disposed between the first component and the second component. With this configuration, the shielding characteristics of the shield wall improve.

According to the present disclosure, the groove in which the shield wall that functions as a shield between components is disposed is formed with a depth that does not reach the third component in the region that overlaps the third component. Therefore, the shield wall does not restrict a mounting area of the circuit board, and high-density mounting of components is possible. In this case, in the region of the groove, which overlaps the third component, no shield wall is formed between the bottom of the groove and the circuit board; however, the electrode is formed on the side surface of the third component. Therefore, the electrode on the side surface closes the portion where no shield wall is formed and is caused to function as a part of a shield between the components. Thus, the shielding characteristics of the shield wall are maintained. When the portion that does not reach the main surface of the circuit board is formed at a portion of the groove forming the shield wall, the groove does not completely separate the sealing resin layer. Therefore, warpage or deformation of the radio-frequency module is suppressed.

BRIEF DESCRIPTION OF THE SEVERAL VIEWS OF THE DRAWINGS

Each of FIGS. 4A and 4B is a view that shows a groove in which a shield wall of FIG. 1 is disposed.

DETAILED DESCRIPTION OF THE DISCLOSURE

First Embodiment

Figure 1:
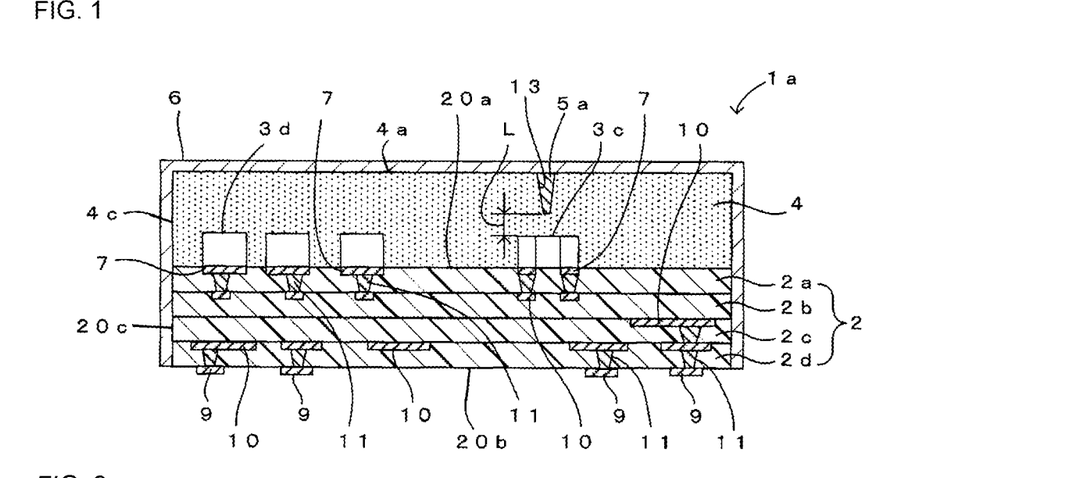
FIG. 1 is a cross-sectional view of a radio-frequency module according to a first embodiment of the present disclosure and is a cross-sectional view taken along the line A-A in FIG. 2.
Figure 2:
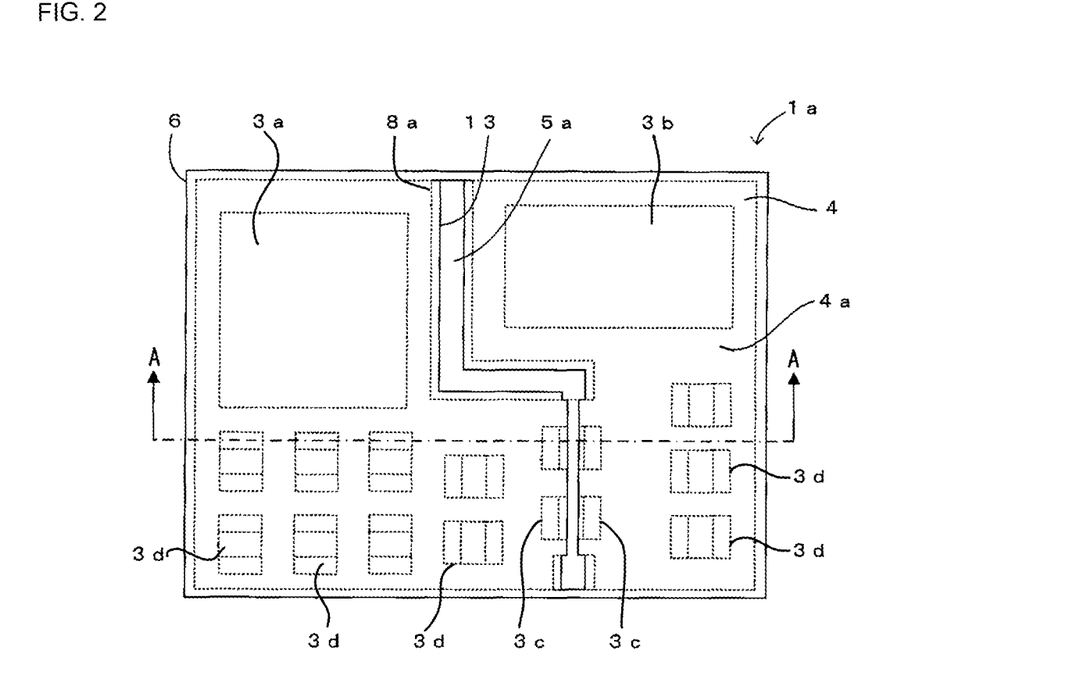
FIG. 2 is a plan view of the radio-frequency module of FIG. 1 in a state where a top surface of a shield film is omitted.
Figure 3:
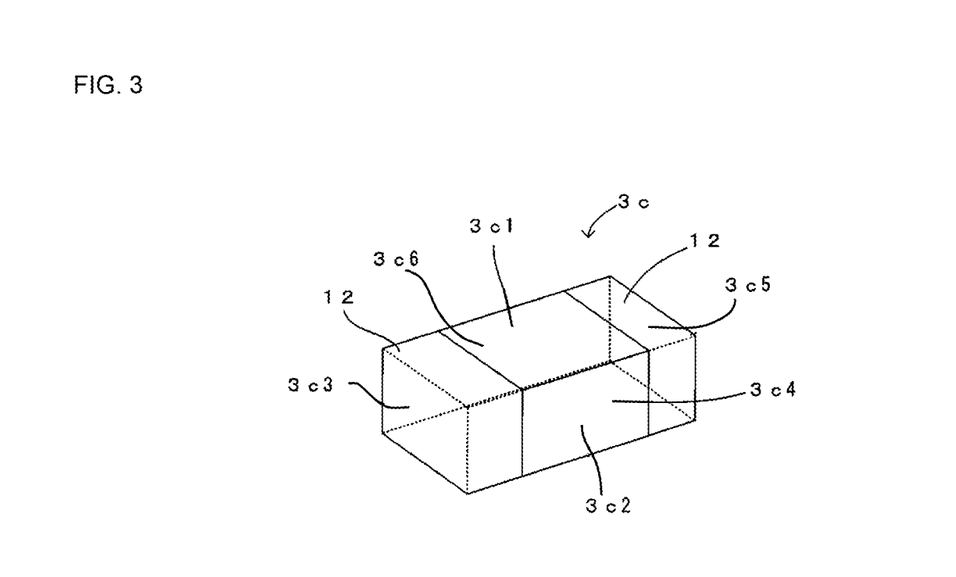
FIG. 3 is a perspective view of a component mounted on a circuit board.
Figure 4A:
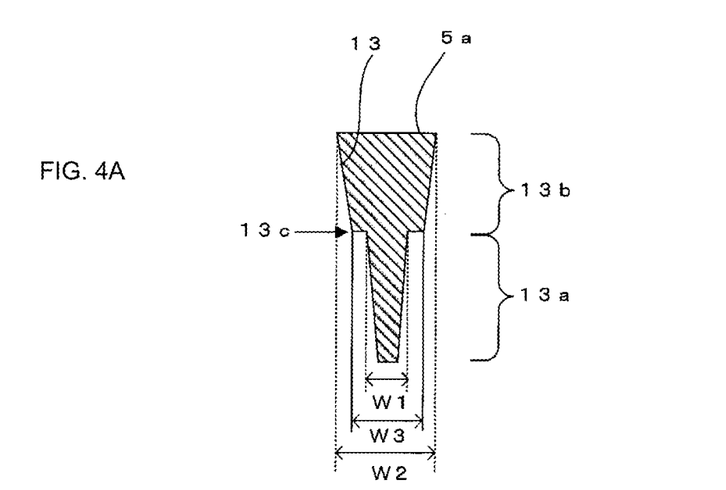
Figure 4B:
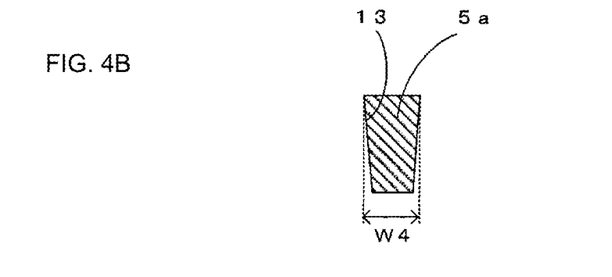

A radio-frequency module 1a according to a first embodiment of the present disclosure will be described with reference to FIG. 1 to FIGS. 4A and 4B. FIG. 1 is a cross-sectional view of the radio-frequency module 1a. FIG. 2 is a plan view of the radio-frequency module 1a in a state where a top surface of a shield film 6 is omitted. FIG. 3 is a perspective view of a component 3c mounted on a multilayer circuit board 2. Each of FIGS. 4A and 4B is a view that shows a groove in which a shield wall 5a of FIG. 1 is disposed.

As shown in FIG. 1 and FIG. 2, the radio-frequency module 1a according to this embodiment includes the multilayer circuit board 2 (which corresponds to a circuit board of the present disclosure), a plurality of components 3a to 3d, a sealing resin layer 4, the shield film 6, and the shield wall 5a. The plurality of components 3a to 3d is mounted on the top surface 20a of the multilayer circuit board 2. The sealing resin layer 4 is laminated on the top surface 20a of the multilayer circuit board 2. The shield film 6 covers the surface of the sealing resin layer 4. The shield wall 5a is provided in the sealing resin layer 4. The radio-frequency module 1a is, for example, mounted on a mother board, or the like, of an electronic device that uses radio-frequency signals.

The multilayer circuit board 2 is made up of, for example, a plurality of laminated electrically insulating layers 2a to 2d made of low-temperature co-fired ceramics, glass epoxy resin, or the like. Mounting electrodes 7 for mounting the components 3a, 3b and a surface layer electrode 8a that is connected to the shield wall 5a are formed on the top surface 20a (which corresponds to a main surface of the circuit board of the present disclosure) of the multilayer circuit board 2. A plurality of outer electrodes 9 for external connection is formed on a bottom surface 20b of the multilayer circuit board 2. In this embodiment, various internal wiring electrodes 10 are disposed between adjacent electrically insulating layers 2a to 2d. A plurality of via conductors 11 for connecting the internal wiring electrodes 10 formed on the different electrically insulating layers 2a to 2d is formed in the multilayer circuit board 2. The surface layer electrode 8a is connected to the internal wiring electrodes that function as ground electrodes.

The mounting electrodes 7, the surface layer electrode 8a, the outer electrodes 9, and the internal wiring electrodes 10 each are made of a metal that is generally used as a wiring electrode, such as Cu, Ag, and Al. The via conductors 11 are made of a metal, such as Ag and Cu. Ni/Au plating may be applied to each of the mounting electrodes 7, the surface layer electrode 8a, and each of the outer electrodes 9.

The components 3a to 3d are semiconductor elements made from semiconductors, such as Si and GaAs, or chip components, such as a chip inductor, a chip capacitor, and a chip resistor. In this embodiment, the component 3a (which corresponds to one of a first component and a second component of the present disclosure) and the component 3b (which corresponds to the other one of the first component and the second component of the present disclosure) each are an active element, such as an IC, and the other components 3c, 3d each are a passive element, such as a chip capacitor and a chip inductor.

As shown in FIG. 3, the components 3c that are passive elements are general rectangular parallelepiped chip components. Terminal electrodes 12 for external connection are formed at two portions. The terminal electrodes 12 are disposed at both end portions in a longitudinal direction of the rectangular parallelepiped shape. One of the terminal electrodes 12 covers the entire surface of one side surface 3c3 (the side surface 3c3 that touches one short side of a top surface 3c1), a part of each of the top surface 3c1 and a bottom surface 3c2 that touch the side surface 3c3, and a part of each of two side surfaces 3c4, 3c6. The other one of the terminal electrodes 12 covers the entire surface of a side surface 3c5 opposed to the one side surface 3c3, a part of each of the top surface 3c1 and the bottom surface 3c2 that touch the side surface 3c5, and a part of each of the two side surfaces 3c4, 3c6.

One of both terminal electrodes 12 is connected to the ground electrodes (internal wiring electrodes 10) inside the multilayer circuit board 2 via the mounting electrodes 7, the via conductors 11, and the like. The bottom surface 3c2 of each component 3c, facing the top surface 20a of the multilayer circuit board 2 in a mounted state, corresponds to a first surface of the third component of the present disclosure. The top surface 3c1 opposed to the bottom surface 3c2 corresponds to a second surface of the third component of the present disclosure. Each of the four side surfaces 3c3 to 3c6 that connect the peripheries of the top surface 3c1 and bottom surface 3c2 of each component 3c corresponds to a side surface of the third component of the present disclosure.

The sealing resin layer 4 is laminated on the multilayer circuit board 2 to cover the top surface 20a of the multilayer circuit board 2 and the components 3a to 3d. The sealing resin layer 4 may be made of a resin that is generally used as a sealing resin, such as epoxy resin.

The shield film 6 is provided to shield the various internal wiring electrodes 10 in the multilayer circuit board 2 and the components 3a to 3d against the noise coming from the outside. The shield film 6 covers a top surface 4a and side surface 4c of the sealing resin layer 4, and a side surface 20c of the multilayer circuit board 2. The shield film 6 may have a multilayer structure having an adhesion film, an electrically conductive film, and a protective film. The adhesion film is laminated on the surface of the sealing resin layer 4. The electrically conductive film is laminated on the adhesion film. The protective film is laminated on the electrically conductive film.

The adhesion film is provided so as to enhance the strength of adhesion between the electrically conductive film and the sealing resin layer 4. The adhesion film may be made of, for example, a metal such as SUS. The electrically conductive film is a layer that is in charge of a substantial shielding function of the shield film 6. The electrically conductive film may be made of, for example, a metal that is any one of Cu, Ag, and Al. The protective film is provided to prevent the corrosion or damage to the electrically conductive film. The protective film may be made of, for example, SUS.

The shield wall 5a is formed so as to be at least disposed in the sealing resin layer 4 between the component 3a and the component 3b that are active elements. Specifically, as shown in FIG. 2, when viewed in a direction perpendicular to the top surface 20a of the multilayer circuit board 2, a groove 13 is formed so as to partition the sealing resin layer 4 into two regions, and the shield wall 5a is formed by filling the groove 13 with electrically conductive paste containing Cu, Ag, or the like, as a main ingredient. When viewed in the direction perpendicular to the top surface 20a of the multilayer circuit board 2, some components 3c out of the components are mounted at a position that overlaps the shield wall 5a. In this embodiment, the groove 13 is formed by laser beam machining. At this time, the groove 13 in the region that overlaps the components 3c (actually, in addition to the region that overlaps the two components 3c, a region near these components) is formed with a depth that does not reach the components 3c, and the groove 13 in the other region is formed with a depth to make the surface layer electrode 8a exposed.

The groove 13 in the region that does not overlap the components 3c has step portions 13c (which correspond to a boundary portion of the present disclosure) resulting from a change in groove width at a middle position in a depth direction (see FIG. 4A). With the step portions 13c as a boundary, the widest groove width W2 of a second stage portion 13b (which corresponds to a wide width portion of the present disclosure) whose depth is shallower is wider than the widest groove width W1 of a first stage portion 13a (which corresponds to a narrow width portion of the present disclosure) whose depth is deeper. The groove width of an end portion of the first stage portion 13a, closer to the step portion 13c in the depth direction (the maximum groove width W1 of the first stage portion 13a) is formed so as to be less than the groove width of an end portion of the second stage portion 13b, closer to the step portion 13c in the depth direction (a minimum groove width W3 of the second stage portion 13b). The first stage portion 13a and second stage portion 13b of the groove 13 each are formed in an expanded shape such that the groove width increases away from the multilayer circuit board 2 in the depth direction. On the other hand, the groove 13 in the region that overlaps the components 3c has no step, and is formed in an expanded shape such that the groove width increases away from the multilayer circuit board 2 in the depth direction (see FIG. 4B). In this embodiment, the widest groove width W4 in this region is narrower than the widest groove width W2 in the region that does not overlap the components 3c.

Since the groove 13 in the region that does not overlap the components 3c is formed with a depth that does not reach the components 3c, no shield wall 5a is formed between the groove 13 and the top surface 20a of the circuit board 2 in this region; however, the terminal electrodes 12 of the components 3c are disposed to fill the portion where no shield wall 5a is formed. Since the terminal electrodes 12 are continuous with the ground, a decrease in the characteristics of the shield between components is minimized by the shield wall 5a. A distance L (see FIG. 1) between the bottom of the groove 13 in the region that overlaps the components 3c and the top surface 3c1 of each component 3c is preferably shorter. However, in light of the machining accuracy of laser beam machining, to reliably avoid exposure of the components 3c, the groove 13 is formed such that the distance L is at least 10 μm and preferably about 20 μm. To maintain shielding characteristics, the distance L is preferably less than or equal to ¼λ when the wavelength of a radio-frequency signal to handle is λ. Therefore, the components 3c are required to have electrodes on the side surfaces 3c3 to 3c6. Alternatively, even when an electrode is formed on the bottom surface 3c2, the structure is also applicable when the distance between the bottom of the groove 13 and the bottom surface 3c2 of each component is ¼λ.

Incidentally, when the shield wall 5a is formed by filling electrically conductive paste, the maximum value of the groove width needs to be at least about 100 μm to ensure the required capability of filling. However, the groove 13 in the region that overlaps the components 3c is shallow in depth, so the groove width W4 may be about 50 μm. The shield wall 5a may be formed not by using electrically conductive paste but by plating. In this case, a conductor can be filled even when the groove width is about 20 μm.

According to the above-described embodiment, the groove 13 in which the shield wall 5a that functions as a shield between components is disposed is formed with a depth that does not reach the components 3c in the region that overlaps the components 3c. Therefore, the shield wall 5a does not restrict a mounting area of the multilayer circuit board 2, and high-density mounting of the components 3a to 3d is possible. In this case, in the region of the groove 13, which does not overlap the components 3c, no shield wall 5a is formed between the bottom of the groove 13 and the top surface 20a of the circuit board 2; however, the terminal electrodes 12 continuous with the ground are formed on the side surfaces 3c3 to 3c6 of each component 3c, so the terminal electrodes 12 close the gap to function as part of a shield between components. Thus, the shielding characteristics of the shield wall 5a are maintained. When the portion that does not reach the top surface 20a of the multilayer circuit board 2 is formed at a portion of the groove 13 that forms the shield wall 5a (the region that overlaps the components 3c), the groove 13 does not completely separate the sealing resin layer 4. Therefore, warpage or deformation of the radio-frequency module 1a is suppressed. In this embodiment, the case where the shape of the groove 13 in the region that does not overlap the components 3c is a two-stage shape is described; however, the disclosure is not limited thereto. Alternatively, a structure in which the depth changes by simply changing the groove width (without a step) may be applied. In other words, a groove shape in which the second stage portion 13b and the first stage portion 13a are continuous with a gentle curved surface may be applied. The structure in which the groove 13 in the region that overlaps the components 3c has no step is described. Alternatively, this structure may be a two-stage structure and may be a structure such that the groove width is narrow. For example, when the groove width is narrowed, the groove width can be narrowed and the groove depth can be made shallow by increasing the laser scanning speed.

When the shield wall 5a is formed by using electrically conductive paste, it becomes difficult to fill the electrically conductive paste up to the groove bottom as the depth of the groove 13 increases. In this embodiment, in a region in which the depth of the groove 13 is deep (the region that does not overlap the components 3c), the groove 13 is formed in two stages as shown in FIG. 4A, so the capability of filling the groove 13 with the electrically conductive paste improves.

(Modification of Radio-Frequency Module 1a)

Figure 5:
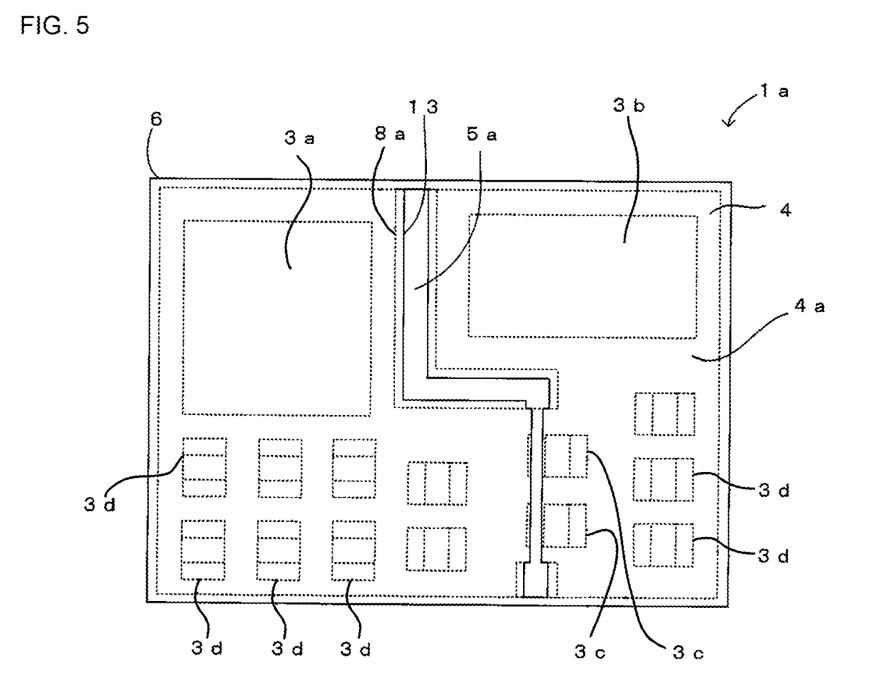
FIG. 5 shows a modification of the radio-frequency module of FIG. 1.

In the above-described embodiment, when viewed in the direction perpendicular to the top surface 20a of the multilayer circuit board 2, the shield wall 5a overlaps the components 3c at a portion where no terminal electrode 12 is provided. Alternatively, for example, as shown in FIG. 5, the shield wall 5a may overlap the components 3c at a portion where the terminal electrodes 12 (portions that cover the top surfaces 3c1) are provided. The terminal electrodes 12 have the function of reducing damage to the components 3c by reflecting laser beam. Therefore, with this configuration, the distance L between each component 3c and the bottom of the groove 13 can be further reduced. In the above-described embodiment, when influence on the components 3c is considered, the distance L needs to be 10 µm and preferably needs to be about 20 µm; however, with this configuration, the distance L may be about 5 µm.

Second Embodiment

Figure 6:
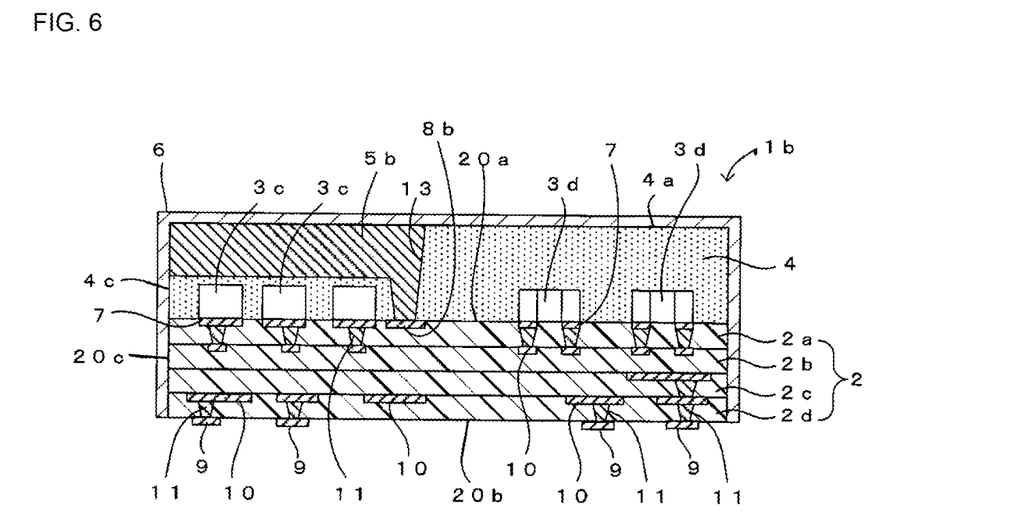
FIG. 6 is a cross-sectional view of a radio-frequency module according to a second embodiment of the present disclosure and is a cross-sectional view taken along the line B-B in FIG. 7.
Figure 7:
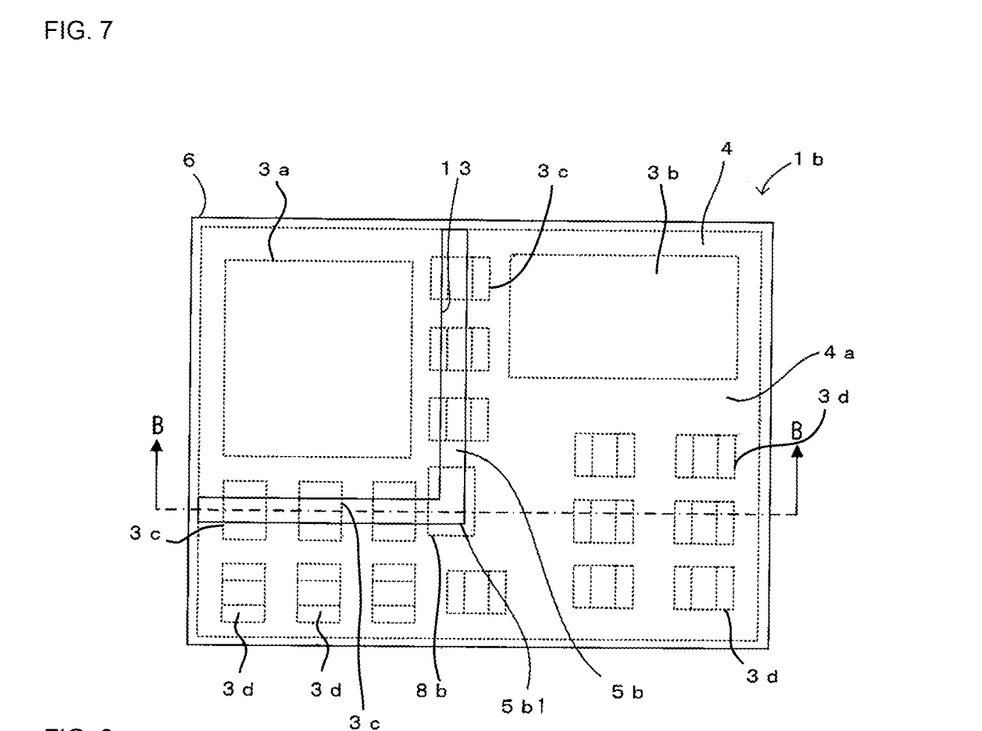
FIG. 7 is a plan view of the radio-frequency module of FIG. 6 in a state where a top surface of a shield film is omitted.

A radio-frequency module 1b according to a second embodiment of the present disclosure will be described with reference to FIG. 6 and FIG. 7. FIG. 6 is a cross-sectional view of the radio-frequency module 1b. FIG. 7 is a plan view of the radio-frequency module 1b in a state where the top surface of the shield film 6 is omitted, and is a view corresponding to FIG. 2.

The radio-frequency module 1b according to this embodiment differs from the radio-frequency module 1a of the first embodiment, described with reference to FIG. 1 to FIGS. 4A and 4B, in, as shown in FIG. 6 and FIG. 7, the configuration of a shield wall, the configuration of disposition of components, and the configuration of a surface layer electrode. The remaining configuration is the same as that of the radio-frequency module 1a of the first embodiment, so like reference numerals are assigned, and the description thereof is omitted.

In this embodiment, a shield wall 5b is formed in a crank shape having an angled portion 5b1 and surrounds the component 3a with the shield wall 5b and the shield film 6 when viewed in the direction perpendicular to the top surface 20a of the multilayer circuit board 2. Some passive elements (components 3c) are arranged along a line formed by the shield wall 5b when viewed in the direction perpendicular to the top surface 20a of the multilayer circuit board 2. In this case, on the top surface 20a of the multilayer circuit board 2, none of the components 3a to 3d is disposed in the region that overlaps the angled portion 5b1, and a rectangular surface layer electrode 8b is formed.

The groove 13 at the angled portion 5b1 where none of the components 3a to 3d is disposed is formed with a depth to make the surface layer electrode 8b exposed, and the shield wall 5b is connected to the surface layer electrode 8b at the angled portion 5b1. The groove 13 in a region other than the angled portion 5b1 is formed with a constant depth that does not reach the components 3c. The surface layer electrode 8b is connected to the ground electrodes (internal wiring electrodes 10) formed inside the multilayer circuit board 2.

In the case where the groove 13 for the shield wall 5b is formed by laser beam machining, or the like, when the groove 13 has the angled portion 5b1, the energy of laser beam is more intensively applied to this portion than the other portion, so the groove becomes deeper under the same laser beam conditions. Therefore, with this configuration, since none of the components 3a to 3d is disposed at the angled portion 5b1, the influence of laser beam on the characteristics of the components 3a to 3d is reduced at the time of the formation of the groove 13. The irradiation conditions of laser beam do not need to be changed according to a portion of the groove 13, so the shield wall 5b is easily formed.

The groove 13 for the shield wall 5b is formed with a depth to make the surface layer electrode 8b exposed only in a region around the angled portion 5b1 and is formed with a depth that does not reach the top surface 20a of the multilayer circuit board 2 in the other region, so high-density mounting of the components 3a to 3d is possible. In this case, there is a possibility that the gap of the shield wall 5b widens and, as a result, shielding characteristics decrease.

However, in this embodiment, the plurality of components 3c is arranged along the shield wall 5b and, therefore, the terminal electrodes 12 of each component 3c are caused to function as a part of a shield between components, so a decrease in shielding characteristics due to the gap of the shield wall 5b is minimized.

Third Embodiment

Figure 8:
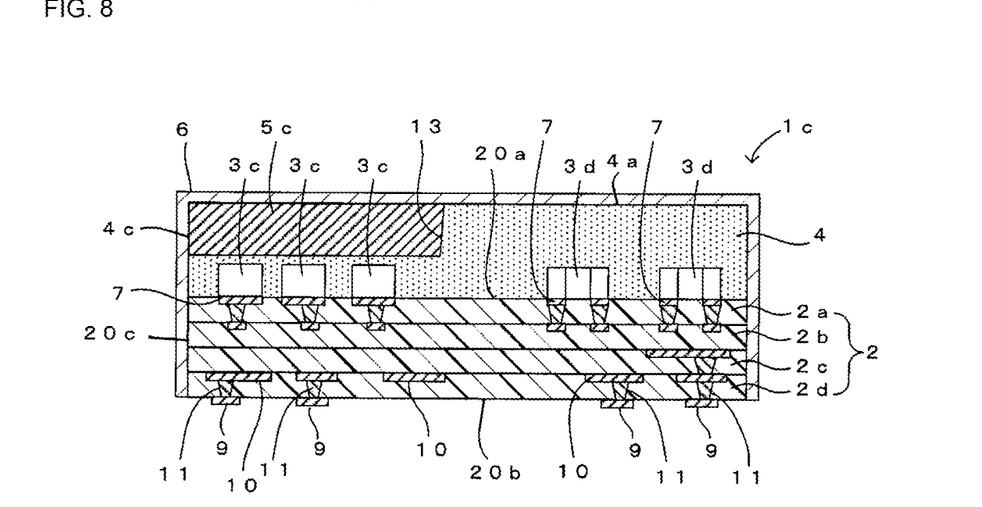
FIG. 8 is a cross-sectional view of a radio-frequency module according to a third embodiment of the present disclosure and is a cross-sectional view taken along the line C-C in FIG. 9.
Figure 9:
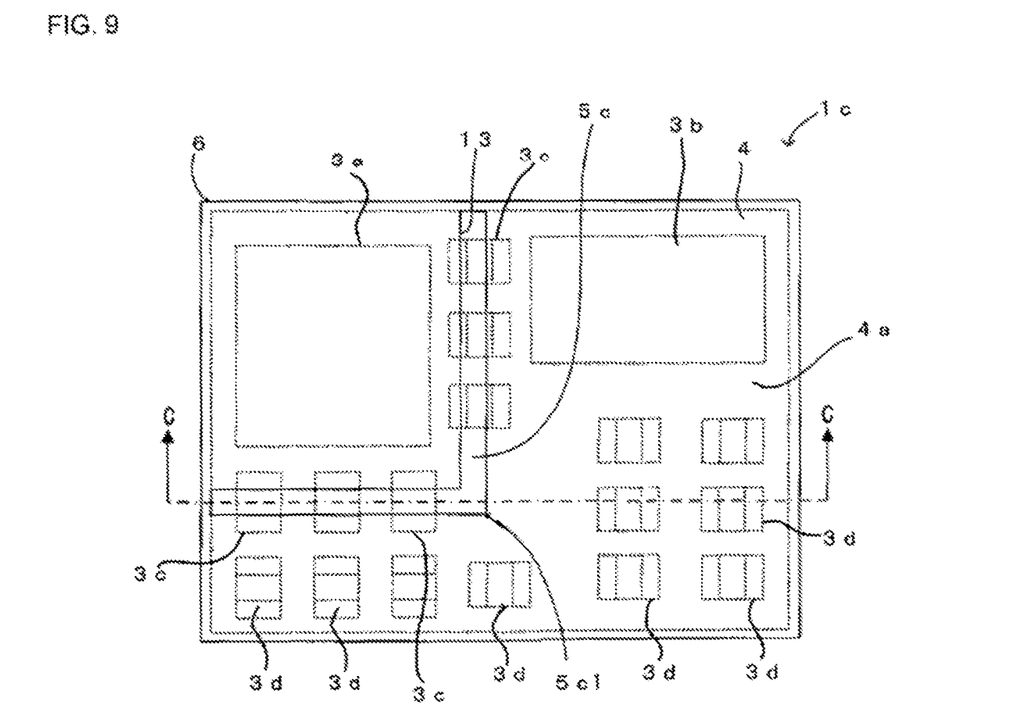
FIG. 9 is a plan view of the radio-frequency module of FIG. 8 in a state where a top surface of a shield film is omitted.

A radio-frequency module 1c according to a third embodiment of the present disclosure will be described with reference to FIG. 8 and FIG. 9. FIG. 8 is a cross-sectional view of the radio-frequency module 1c. FIG. 9 is a plan view of the radio-frequency module 1c in a state where the top surface of the shield film 6 is omitted, and is a view corresponding to FIG. 2.

The radio-frequency module 1c according to this embodiment differs from the radio-frequency module 1b of the second embodiment, described with reference to FIG. 6 and FIG. 7, in that, as shown in FIG. 8 and FIG. 9, no surface layer electrode is provided and the configuration of a shield wall is different. The remaining configuration is the same as that of the radio-frequency module 1b of the second embodiment, so like reference numerals are assigned, and the description thereof is omitted.

The shield wall 5b of the above-described second embodiment is formed with such a depth that the groove 13 at the angled portion 5b1 reaches the top surface 20a of the multilayer circuit board 2; however, a shield wall 5c of this embodiment is formed such that the groove 13 at an angled portion 5c1 has the same depth as the groove 13 in the region other than the angled portion 5c1. In other words, the shield wall 5c has no portion that comes in contact with the top surface 20a of the multilayer circuit board 2, and the groove 13 for the shield wall 5c is formed with a constant depth that does not reach the components 3c in all the regions. The shield film 6 is connected to the ground electrodes (internal wiring electrodes 10) exposed to the side surface 20c of the multilayer circuit board 2. The top end portion of the shield wall 5c is connected to the shield film 6, so the shield wall 5c is grounded via the shield film 6.

With this configuration, the groove 13 in which the shield wall 5c is disposed does not reach the top surface 20a of the multilayer circuit board 2. Therefore, when the groove 13 is formed by laser beam machining, the influence of laser beam on the multilayer circuit board 2 is reduced. A mounting region for components increases, so high-density mounting of components is possible. When the depth of the groove 13 is made constant, the groove is formed under the same irradiation conditions of laser beam. Therefore, the shield wall 5c is easily formed. When the groove 13 for forming the shield wall 5c is formed with a depth that does not reach the top surface 20a of the multilayer circuit board 2 in all the regions, the groove 13 does not completely separate the sealing resin layer 4. Therefore, warpage or deformation of the radio-frequency module 1c is suppressed.

The present disclosure is not limited to the above-described embodiments. Various modifications other than the above-described ones may be made without departing from the purport of the present disclosure. For example, some of the configurations of the above-described embodiments and modification may be combined.

The case where, for the groove 13 in which the shield wall 5a of the described first embodiment is disposed, the widest groove width W4 in the region that overlaps the components 3c is narrower than the widest groove width W2 of the second stage portion 13b in the region that does not overlap the components 3c is described. Alternatively, these groove widths may be equal or substantially equal to each other.

The number of electrically insulating layers and wiring layers that make up the multilayer circuit board 2 may be changed as needed.

The present disclosure is applicable to various radio-frequency modules including a sealing resin layer that covers components mounted on a circuit board and a shield wall that prevents mutual noise interference between the components.

1a to 1c radio-frequency module
2 multilayer circuit board (circuit board)
3a, 3b component (first component, second component)
3c component (third component)
4 sealing resin layer
5a to 5c shield wall
5b1 angled portion
12 terminal electrode (electrode)
13 groove

The invention claimed is:
1. A radio-frequency module comprising:
a circuit board;
a first component, a second component, and a plurality of third components, each third component having two electrodes at opposite sides, wherein the first component, the second component, and the plurality of third components are mounted on a main surface of the circuit board;
a sealing resin layer laminated on the main surface of the circuit board, the sealing resin layer sealing the first component, the second component, and the plurality of third components; and
a shield wall disposed in a groove provided in the sealing resin layer, wherein
the groove is disposed between the first component and the second component, overlapping each third component, when viewed in a direction perpendicular to the main surface of the circuit board,
a lower end portion of the shield wall is provided with a depth not reaching each third component,
each third component has a first surface facing the main surface of the circuit board, a second surface opposed to the first surface, and two opposite side surfaces connecting the first surface and the second surface,
wherein the shield wall is disposed over a middle top surface between the two electrodes provided on the two opposite side surfaces of the at least one each third component, and
one of the two electrodes each third component and the shield wall are connected to a ground,
wherein the shield wall is disposed over respective middle top surfaces between the two electrodes of each third component, dividing the sealing resin layer into multiple sections.

2. The radio-frequency module according to claim 1, wherein, when viewed in the direction perpendicular to the main surface of the circuit board, each of the two electrodes is provided to enclose an end portion of each third component.

3. The radio-frequency module according to claim 2, wherein
the shield wall has an angled portion when viewed in the direction perpendicular to the main surface of the circuit board,
each third component is not disposed at a portion overlapping the angled portion of the shield wall when viewed in the direction perpendicular to the main surface of the circuit board, and
a portion of the groove located at the angled portion is provided with a depth to make the main surface of the circuit board exposed.

4. The radio-frequency module according to claim 2, wherein
each third component includes a plurality of components, when viewed in the direction perpendicular to the main surface of the circuit board, the plurality of components is arranged along the shield wall, and
the groove is provided with a constant depth to make the main surface of the circuit board not exposed.

5. The radio-frequency module according to claim 2, wherein
when viewed in the direction perpendicular to the main surface of the circuit board, a portion of the groove in a region of the shield wall not overlapping each third component, has
a wide width portion provided in a shallow region in a depth direction and having a wider groove width,
a narrow width portion provided in a deep region in the depth direction and having a narrower groove width, and
a boundary portion continuously connecting the wide width portion and the narrow width portion,
the wide width portion is provided such that a groove width of an end portion closer to the boundary portion in the depth direction is wider than a groove width of an end portion closer to the boundary portion in the depth direction of the narrow width portion, and a maximum value of the groove width of the narrow width portion is less than a maximum value of the groove width of the wide width portion, and
when viewed in the direction perpendicular to the main surface of the circuit board, a maximum value of a width of the lower end portion of the groove is less than a maximum value of a width of an upper portion of the groove.

6. The radio-frequency module according to claim 2, wherein the shield wall is connected to a ground electrode provided on or in the circuit board in a region disposed between the first component and the second component.

7. The radio-frequency module according to claim 1, wherein
the shield wall has an angled portion when viewed in the direction perpendicular to the main surface of the circuit board,
each third component is not disposed at a portion overlapping the angled portion of the shield wall when viewed in the direction perpendicular to the main surface of the circuit board, and
a portion of the groove located at the angled portion is provided with a depth to make the main surface of the circuit board exposed.

8. The radio-frequency module according to claim 7, wherein
each third component includes a plurality of components, when viewed in the direction perpendicular to the main surface of the circuit board, the plurality of components is arranged along the shield wall, and
the groove is provided with a constant depth to make the main surface of the circuit board not exposed.

9. The radio-frequency module according to claim 7, wherein
when viewed in the direction perpendicular to the main surface of the circuit board, a portion of the groove in a region of the shield wall not overlapping the at least one each third component, has a wide width portion provided in a shallow region in a depth direction and having a wider groove width, a narrow width portion provided in a deep region in the depth direction and having a narrower groove width, and a boundary portion continuously connecting the wide width portion and the narrow width portion, the wide width portion is provided such that a groove width of an end portion closer to the boundary portion in the depth direction is wider than a groove width of an end portion closer to the boundary portion in the depth direction of the narrow width portion, and a maximum value of the groove width of the narrow width portion is less than a maximum value of the groove width of the wide width portion, and when viewed in the direction perpendicular to the main surface of the circuit board, a maximum value of a width of the lower end portion of the groove of the shield wall is less than a maximum value of a groove width of the wide width portion.

10. The radio-frequency module according to claim 7, wherein the shield wall is connected to a ground electrode provided on or in the circuit board in a region disposed between the first component and the second component.

11. The radio-frequency module according to claim 1, wherein each third component includes a plurality of components, when viewed in the direction perpendicular to the main surface of the circuit board, the plurality of components is arranged along the shield wall, and the groove is provided with a constant depth to make the main surface of the circuit board not exposed.

12. The radio-frequency module according to claim 11, wherein the shield wall is connected to a ground electrode provided on or in the circuit board in a region disposed between the first component and the second component.

13. The radio-frequency module according to claim 1, wherein when viewed in the direction perpendicular to the main surface of the circuit board, a portion of the groove in a region of the shield wall not overlapping each third component, has a wide width portion provided in a shallow region in a depth direction and having a wider groove width, a narrow width portion provided in a deep region in the depth direction and having a narrower groove width, and a boundary portion continuously connecting the wide width portion and the narrow width portion, the wide width portion is provided such that a groove width of an end portion closer to the boundary portion in the depth direction is wider than a groove width of an end portion closer to the boundary portion in the depth direction of the narrow width portion, and a maximum value of the groove width of the narrow width portion is less than a maximum value of the groove width of the wide width portion, and when viewed in the direction perpendicular to the main surface of the circuit board, a maximum value of a width of the lower end portion of the groove is less than a maximum value of a width of an upper portion of the groove.

14. The radio-frequency module according to claim 13, wherein the shield wall is connected to a ground electrode provided on or in the circuit board in the region disposed between the first component and the second component.

15. The radio-frequency module according to claim 1, wherein the shield wall is connected to a ground electrode provided on or in the circuit board in a region disposed between the first component and the second component.

16. The radio-frequency module according to claim 1, wherein the two electrodes of each third component are in a height not reaching the lower end portion of the groove.

* * * * *